(12) United States Patent
Chen

(10) Patent No.: US 9,579,723 B2
(45) Date of Patent: Feb. 28, 2017

(54) MOLYBDENUM-NIOBIUM ALLOY PLATE TARGET MATERIAL PROCESSING TECHNIQUE

(71) Applicant: Baoji Kedipu Nonferrous Metals Processing Co., Ltd., Baoji (CN)

(72) Inventor: Yuzhu Chen, Baoji (CN)

(73) Assignee: Baoji Kedipu Nonferrous Metals Processing Co., LTD., Baoji (CN)

( * ) Notice: Subject to any disclaimer, the term of this patent is extended or adjusted under 35 U.S.C. 154(b) by 496 days.

(21) Appl. No.: 14/129,084

(22) PCT Filed: Jan. 8, 2013

(86) PCT No.: PCT/CN2013/070190
§ 371 (c)(1),
(2) Date: Dec. 23, 2013

(87) PCT Pub. No.: WO2013/104295
PCT Pub. Date: Jul. 18, 2013

(65) Prior Publication Data
US 2014/0134037 A1 May 15, 2014

(30) Foreign Application Priority Data

Jan. 12, 2012 (CN) .......................... 2012 1 0009053

(51) Int. Cl.
| | | |
|---|---|---|
| C22C 27/04 | (2006.01) | |
| C22C 1/04 | (2006.01) | |
| C22F 1/18 | (2006.01) | |
| B22F 3/04 | (2006.01) | |
| B22F 3/10 | (2006.01) | |
| B22F 3/17 | (2006.01) | |
| B22F 3/18 | (2006.01) | |
| B22F 1/00 | (2006.01) | |
| B22F 3/24 | (2006.01) | |
| C22C 27/00 | (2006.01) | |
| C23C 14/34 | (2006.01) | |

(52) U.S. Cl.
CPC ............... B22F 3/24 (2013.01); C22C 1/045 (2013.01); C22C 27/00 (2013.01); C22C 27/04 (2013.01); C22F 1/18 (2013.01); C23C 14/3414 (2013.01); B22F 2998/10 (2013.01)

(58) Field of Classification Search
CPC ............... B22F 2998/10; B22F 1/0003; B22F 2003/247; B22F 3/04; B22F 3/10; B22F 3/17; B22F 3/18; B22F 3/24; C22C 1/045; C22C 27/00; C22C 27/04; C22F 1/18; C23C 14/3414
See application file for complete search history.

(56) References Cited

U.S. PATENT DOCUMENTS

| | | | | |
|---|---|---|---|---|
| 2005/0230244 A1* | 10/2005 | Inoue | ...................... | C22C 1/045 204/298.13 |
| 2006/0172454 A1* | 8/2006 | Reis | ........................ | C22C 27/04 438/77 |
| 2009/0290685 A1* | 11/2009 | Aoyama | ................. | C22C 1/045 378/144 |

FOREIGN PATENT DOCUMENTS

| | | |
|---|---|---|
| CN | 1676661 | 10/2005 |
| CN | 101326297 | 12/2008 |
| CN | 102321871 | 1/2012 |
| CN | 102337418 | 2/2012 |
| CN | 102560383 | 10/2013 |
| JP | 2008-280570 | 11/2008 |

OTHER PUBLICATIONS

Machine English Translation of CN 102321871.*
Machine English Translation of CN 102041402.*

* cited by examiner

*Primary Examiner* — Veronica F Faison
(74) *Attorney, Agent, or Firm* — Clayton, Howarth & Cannon, P.C.

(57) ABSTRACT

The processing technology of a molybdenum-niobium alloy plate target shall be implemented as follows: (1) mix: divide a certain amount of molybdenum powder and niobium powder into, at least, three small portions, and mix each portion of them into a mixed powder. After several rounds of mixing and sieving, a mixed alloy powder will be achieved from a plurality of mixed powders; divide the mixed alloy powder into three portions and mix each portion with other materials, a uniform alloy powder will be obtained by mixing the three portions together; (2) shaping: the alloy compact, which is formed after isostatic pressing, shall be sintered in a high-temperature intermediate frequency furnace for at least 3 hours under protection of hydrogen. The sintering temperature includes three zones, i.e. 0° C.~800° C., 800° C.~1600° C. and 1600° C.~2000° C., and the alloy compact shall be sintered in each of the three temperature zones. An alloy compact shape will be formed in the end; (3) forging and rolling: after the forging and densification under a temperature of 1200° C.~100° C., the alloy compact is rolled into the plate for material preparation under a heating temperature of 1500° C.~1600° C.; (4) finish machining: the final molybdenum-niobium alloy plate target is achieved by cutting, accurate grinding and machining. The blank of the invention is the refined grain with a relatively uniform size.

2 Claims, No Drawings

MOLYBDENUM-NIOBIUM ALLOY PLATE TARGET MATERIAL PROCESSING TECHNIQUE

CROSS-REFERENCE TO RELATED APPLICATIONS

This application is a national application under 35 U.S.C. §371 of international application no. PCT/CN2013/070190, with an international filing date of Jan. 8, 2013, entitled "MOLYBDENUM-NIOBIUM ALLOY PLATE TARGET MATERIAL PROCESSING TECHNIQUE," which is hereby incorporated by reference herein in its entirety, including but not limited to those portions that specifically appear hereinafter. The foregoing incorporation by reference is made with the following, exception: in the event that any portion of the above-referenced application is inconsistent with this application, this application supercedes said portion of said above-referenced application.

STATEMENT REGARDING FEDERALLY SPONSORED RESEARCH OR DEVELOPMENT

Not Applicable.

BACKGROUND

1. The Field of the Present Disclosure

The present invention pertains to the field of metal material processing technology, especially the processing of non-ferrous metal alloys.

2. Description of Related Art

Molybdenum-niobium alloy (99% Mo and 10% Nb) targeting plates are critical materials for Flat Panel Display (FPD) and are used in large quantity in the molybdenum-niobium alloys for Liquid Crystal Display (LCD) source cuboid liquid crystal display, field emission display, organic light-emitting display, plasma display panels, cathodoluminescence display, vacuum fluorescent display, TFT flexible display and touch screens, etc. Electron beam evaporation of panel display processes can make Niobium deposit at the top end of emitter, which will be very helpful in developing large screens with high definition.

Currently, the final sintered Indium Tin Oxide (ITO) target is a simple indium sesquioxide structure. And the applied processes are essentially hot isostatic pressing and hot-pressing, which are the main processes used around the world to produce ITO targets. Corning, Samsung in Korea is the only company whose technology is introduced from Japan, and its products are mainly used for Thin Film Transistor (TFT) liquid crystal production, and are partially used for Super Twisted Nematic (STN). The manufacturing techniques of ITO targets produced in Japan are similar with those of the current TFT, but there are still cracks (pores) in the products, and the density has not yet met target standards.

The hot isostatic pressing or hot-pressing techniques used domestically at present are not able to produce targets used for STN. The molybdenum-niobium alloy target, whose density needs to be improved, is applicable for STN, TFT, Organic Light-Emitting Diode (OLED) anodes and flexible display apparatuses.

Currently, aluminium base alloy targets are drawing close attention while molybdenum-niobium alloy targets draw the highest attention from the public. When the distance between the two lines to be displayed is approximately 20 μm, finer grains of aluminum will be generated under the action of current flow, in this case, a short circuit easily happens with the next line bridge. We propose that the high resolution TFT needs higher pixels, on this basis molybdenum-niobium alloys are being researched and developed. The fifth generation of international line display use aluminium base alloys which are imported from Japan. By using Japanese processes, Nb sis be mixed into the aluminium base alloy thereby solving technical problems. During aluminum production, the size of the grains is difficult is control, if the grains are too large and the grain orientation of adjacent grains are different, the sputtering speeds of targets and lines will be nonuniform. Other materials which can penetrate the conducting films of metallic oxide targets used for ITO molybdenum tin and electrode penetrating are magnesia-alumina-titania, wherein magnesium is mainly used in OLED, and ITO, and aluminium alloy molybdo-chrome copper is used in FPD, tin oxide is used in some parts of the flexible display, the magnesium alloy, aluminium alloy and tin oxide are used in ITO, other alloy targets and Plasma Display Panel) PDP, the main content of touch screen is tin oxide, and the OLED is mainly composed of magnesium alloy. The following technical problems of PPD materials need to be resolved:

1. Homogenization and refining of materials crystal structure.
2. Reduction of oxygen content in the powder metallurgy.
3. Electron transfer of electrode materials alloying and crystal refining.
4. Anti-corrosion and easy corrosion/alloy of low electrical resistivity.
5. Development of reflectance coating materials and transparent conducting films with high density.
6. During the development of low moisture-penetrability, high softness and transparent medium, the molybdenum-niobium alloy will be used to replace the no material with high power, low electrical resistivity, low brittleness and low transparency. The structure and content of the alloy are distributed equally with fine grains, are corrosion resistance, have high reflectivity, low electrical resistivity, good corrosion performance, a stable evaporation rate and low ratio of work versus function. In applying a alloying element with 90% Molybdenum and 5%~10% Niobium, its melting point is higher than that of other molybdenum-based alloys. The improvement in density, Niobium evenness, extensibility and softness needs further research.

DETAILED DESCRIPTION

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure claimed.

In describing and claiming the present disclosure, the following terminology will be used in accordance with the definitions set out below. As used in this specification and the appended claims, the singular forms "a," "an," and "the" include plural referents unless the context clearly dictates otherwise. As used herein, the terms "comprising," "including," "having," "containing," "characterized by," and grammatical equivalents thereof are inclusive or open-ended terms that do not exclude additional, unrecited elements or method steps.

This invention will be further detailed combining the drawings and its embodiments, so that the above purposes, characteristics, and advantages of this invention will be easier to understand.

The invention provides a processing technology for molybdenum-niobium alloy plate targets with fine grains and high quality. The molybdenum-niobium alloy plate target is featured by its the high melting point, high-temperature strength, high-temperature tenacity, good heat resistance, heat and electrical conduction, and a small coefficient of thermal expansion. Adding a certain amount of Niobium into the molybdenum can improve the pixels of liquid crystal displays by more than two fold and is a breakthrough in developing large display screens with long electrodes, high definition, large information capacity and high resolution.

The weight difference between the Molybdenum and Niobium in the molybdenum-niobium alloy is great, the grain structures of the elements are different, and the atomic radius difference of Molybdenum and Niobium is small, therefore surrounding pressure will occur around the molybdenum atoms when they are replaced by niobium atoms during alloying, and lattice distortion will easily be caused by the control force around the niobium atoms. At the same time, the internal stress of the lattice distortion, which can cause large segregation and poor integration of grain structure during the alloying process, is also great, and this will make the alloy performance unstable and the later heat processing extremely difficult after embrittlement. Meanwhile, it will be very difficult to get an alloy which can be rolled and stretched arbitrarily. In order to get a correct and feasible processing technology, designers can apply and compare three alloying production modes. Mode I: electron beam smelting method, add the molybdenum strips or pieces into a certain amount of niobium strips or pieces, tie them up as electrodes to melt them at high temperature, get an alloy compact after secondary melting for later processing. Mode II: vacuum sintering method, compress the molybdenum-niobium alloy powder into a shaped compact shape, get the alloy compact with the high-temperature vacuum furnace burning method, and get a final product after later processing. Mode III: apply powder metallurgy alloy powder to obtain alloy compacts in the intermediate frequency high temperature furnace followed by isostatic pressing under the protection of hydrogen for later processing.

After comparison it shows that the alloying process of alloy compact ingot will be unstable when mode I is applied.

When molybdenum atoms are replaced by niobium atoms, resistance to diffusion needs to be overcome, the inflated grains and irregular shape will make the later heat processing difficult. Mode II doesn't include the process of gas catalytic reduction, the smelting is adverse to the replacement and integration, as a result, alloys with uniform contents are hard to obtain. The alloy composition with serious segregation, and the developed arborization or columnar crystal will make the alloy performance unstable, embrittle the alloy and thus break it along the grain boundary, then irregular cracks will occur on the alloy and make the subsequent hot processing plasticity very poor.

The processing technology of molybdenum-niobium alloy plate targets, which can help realize the purpose of the invention, shall be implemented as follows:

(1) Mixing: divide a certain amount of molybdenum powder and niobium powder into at least three small portions, and mix each portion of molybdenum powder with niobium powder into a mixed powder of molybdenum and niobium. After several rounds of mixing and sieving of the molybdenum powder and the niobium powder, a mixed alloy powder of molybdenum and niobium is obtained. The mixed alloy powder is divided into three portions and mixing each portion with other portions of the mixed alloy powder to obtain an uniform alloy powder mixture;

(2) Shaping: the alloy compact, which is formed after isostatic pressing, shall be sintered in the high-temperature intermediate frequency furnace for at least 3 hours under the protection of hydrogen, the sintering temperature includes three zones, i.e. 0° C.~800° C., 800° C.~1600° C. and 1600° C.~2000° C., and the alloy compact shall be sintered in each of the three temperature zones, the alloy compact shape can be formed in the end;

(3) Forging and rolling: after forging and densification under a temperature of 1200° C.~1400° C., the alloy compact is roiled into plates for material preparation under a heating temperature of 1500° C.~1600° C.;

(4) Finish machining: the final molybdenum-niobium alloy plate target is achieved by cutting, accurate grinding and machining. The blank of the invention is the refining grain with a relatively uniform size.

The alloy powder claimed in step (1) includes 90 wt %~95 wt % molybdenum powder and 5 wt %~10 wt % niobium powder.

The beneficial effects of the processing technology of molybdenum-niobium alloy plate targets in the invention are as follows:

The processing technology of molybdenum-niobium alloy plate targets strictly controls the raw materials purity and granularity, it applies the blended treatment method by dividing the raw materials into several portions to form pre-alloy powders with even contents. After comparison it shows that the alloy achieved in this way is better than the alloy mixed as a whole, in satisfying the target requirements. In addition the alloy is sintered under three different temperatures and is restored at a pre-alloy stage with the protection of pure hydrogen, as a result, the obtained blank is finely grained and the grain sizes are almost identical. The contents are uniform and the degree of segregation of the alloy belonging to the isometric system is just 0.3%. The practice of proper molybdenum-niobium alloying shows that the more uniform the alloying is, the more helpful it will be to the processing. The qualified molybdenum-niobium alloy plate target can be produced and received by users after high-temperature forging, rolling, cutting and accurate grinding.

The processing technology of molybdenum-niobium alloy plate targets in the invention is carried out as follows: mix 90%~95% $Mo^{-1}$ powder (first grade molybdenum powder) and 5%~10% $Nb^{-1}$ powder (first grade niobium powder) together to make a mixed alloy powder after several rounds of mixing and sieving, other materials may be added by dividing the mixed alloy powder into three portions and compound them together in the end as an uniform alloy powder. Achieve the alloy compact through isostatic pressing, sinter them in a high-temperature intermediate frequency furnace under the protection of hydrogen to get the final alloy compact shape, the sintering temperature includes three zones, i.e. 0° C.~800° C., 800° C.~1600° C., 1600° C.~2000° C. After the high-temperature forging and densification under a temperature of 1200° C.~1400° C. in the high temperature furnace, roll the alloy compact into the plate for material preparation under a heating temperature of 1500° C.~1600° C. The final molybdenum-niobium alloy plate target is achieved by cutting, accurate grinding and machining. After rolling, there shall be no pores or cracks and the structure shall be uniform, and the surface evenness must reach 0.2/650 m.

The Embodiments claimed above are only the descriptions to the preferred implementation methods of the invention, not limitations on the scope of the invention. All transformations and improvements to the technical solutions of the invention made by the common engineering technicians shall fall under the determined scope of protection of the Claims without violating the design sprits of the invention.

All embodiments in this Specification are described in a progressive manner. Description of each embodiment is emphasized on its difference from other embodiments and reference can be made to each other for the identical and similar parts of the embodiments.

What is claimed is:

1. A process of preparing a molybdenum-niobium alloy plate target comprising the steps of:
    (1) obtaining a certain amount of molybdenum powder and niobium powder and dividing said molybdenum powder and niobium powder into at least three small portions, mixing each portion of said molybdenum powder and niobium powder to obtain a mixture of portions of molybdenum powder and niobium powder; after several rounds of mixing and sieving, multiple said mixtures of portions of molybdenum powder and niobium powder are combined to obtain a mixture alloy powder of molybdenum and niobium, dividing said mixed alloy powder into three portions and mixing each portion with each other to obtain an uniform alloy powder;
    (2) placing said uniform alloy powder under isostatic pressing to obtain an alloy compact which is sintered in a high-temperature intermediate frequency furnace for at least 3 hours under the protection of hydrogen, said sintering temperature includes three zones consisting of 0° C.~800° C., 800° C.~1600° C. and 1600° C.~2000° C., said alloy compact being sintered in each of the three temperature zones;
    (3) forging and rolling said alloy compact under a temperature of 1200° C.~1400° C., rolling said alloy compact under a heating temperature of 1500° C.~1600° C. into a plate for further material preparation steps comprising cutting, accurate grinding and machining.

2. The processing according to claim 1, wherein the alloy powder comprising 90 wt %~95 wt % of molybdenum powder and 5 wt %~10 wt % niobium powder.

* * * * *